US007956982B2

(12) United States Patent
Hol et al.

(10) Patent No.: US 7,956,982 B2
(45) Date of Patent: Jun. 7, 2011

(54) APPARATUS FOR COOLING

(75) Inventors: Sven Antoin Johan Hol, Yokohama (JP); Angelo Cesar Peter De Klerk, Etten-Leur (NL); Erik Roelof Loopstra, Heeze (NL); Fransicus Mathijs Jacobs, Asten (NL); Mark Scholten, Buchten (NL)

(73) Assignee: ASML Netherlands B.V., Veldhoven (NL)

( * ) Notice: Subject to any disclaimer, the term of this patent is extended or adjusted under 35 U.S.C. 154(b) by 507 days.

(21) Appl. No.: 11/281,901

(22) Filed: Nov. 18, 2005

(65) Prior Publication Data

US 2007/0114655 A1    May 24, 2007

(51) Int. Cl.
*G03B 27/52* (2006.01)
*G03B 27/42* (2006.01)
*G03B 27/58* (2006.01)
*G03B 27/62* (2006.01)
*H02K 41/02* (2006.01)

(52) U.S. Cl. ............... 355/30; 355/53; 355/72; 355/75; 310/12.29

(58) Field of Classification Search ............... 355/53, 355/72, 75, 30; 310/12, 12.29; 165/104.33
See application file for complete search history.

(56) References Cited

U.S. PATENT DOCUMENTS

| 5,703,420 | A | * | 12/1997 | Kamata et al. ............... 310/54 |
| 5,783,877 | A | * | 7/1998 | Chitayat ............... 310/12.33 |
| 6,025,658 | A | | 2/2000 | Kamata |
| 6,084,319 | A | * | 7/2000 | Kamata et al. ............... 310/12 |
| 6,114,781 | A | * | 9/2000 | Hazelton et al. ............... 310/12 |
| 6,271,606 | B1 | | 8/2001 | Hazelton |
| 6,657,204 | B2 | | 12/2003 | Buis et al. |
| 6,762,516 | B2 | * | 7/2004 | Maruyama ............... 310/12 |
| 2001/0013580 | A1 | * | 8/2001 | Buis et al. ............... 250/492.22 |
| 2001/0055102 | A1 | | 12/2001 | Emoto |
| 2003/0011254 | A1 | * | 1/2003 | Ukaji ............... 310/64 |
| 2005/0012403 | A1 | * | 1/2005 | Binnard ............... 310/12 |
| 2005/0116549 | A1 | * | 6/2005 | Ito ............... 310/12 |
| 2005/0183604 | A1 | | 8/2005 | Bruno et al. |

FOREIGN PATENT DOCUMENTS

EP    1 457 833 A2    9/2004

OTHER PUBLICATIONS

International Search Report and Written Opinion for PCT/IB2006/004286 dated Jul. 14, 2008.
Chinese Office Action for Chinese Application No. 200680043037.6 dated Feb. 12, 2010.

* cited by examiner

*Primary Examiner* — Hung Henry Nguyen
*Assistant Examiner* — Steven H Whitesell-Gordon
(74) *Attorney, Agent, or Firm* — Pillsbury Winthrop Shaw Pittman LLP

(57) ABSTRACT

A cooling apparatus is described that has a first cooling structure, in thermal contact with a heat source having a temperature greater than a cool structure, including a channel through which a cooling fluid is passed, an isolator between the heat source and the cool structure, the isolator in thermal contact with the first cooling structure and including a material of low thermal conductivity, and a second cooling structure between the isolator and the cool structure, the second cooling structure including a channel through which cooling fluid is passed.

21 Claims, 7 Drawing Sheets

APPARATUS FOR COOLING

FIELD

The present invention relates generally to arrangements and/or methods for cooling.

BACKGROUND

A lithographic exposure apparatus is a machine that applies a desired pattern onto a target portion of a substrate. Lithographic exposure apparatus can be used, for example, in the manufacture of integrated circuits (ICs). In that circumstance, a patterning structure, which is alternatively referred to as a mask or a reticle, may be used to generate a circuit pattern corresponding to an individual layer of the IC, and this pattern can be imaged onto a target portion (e.g. comprising part of, one or several dies) on a substrate (e.g. a silicon wafer) that has a layer of radiation-sensitive material (resist). In general, a single substrate will contain a network of adjacent target portions that are successively exposed. Known lithographic exposure apparatus include so-called steppers, in which each target portion is irradiated by exposing an entire pattern onto the target portion at one time, and so-called scanners, in which each target portion is irradiated by scanning the pattern through the projection beam in a given direction (the "scanning"-direction) while synchronously scanning the substrate parallel or anti-parallel to this direction. It is also possible to transfer the pattern from the patterning structure to the substrate by imprinting the pattern onto the substrate.

In a lithographic apparatus, coil motors (such as Lorentz-force motors) are used, for example, to position a substrate table and/or a support structure configured to hold a patterning structure (e.g., a mask table). The motors dissipate heat in operation which, if not removed in a controlled manner, could affect the thermal stability of the apparatus. For example, in the case of positioning of a substrate table, heat transfer from the motor to the substrate table should be low. The substrate table is designed to be operated at a certain temperature and heat transfer to the substrate table may lead to expansion or contraction in the substrate table and/or the substrate causing an inaccuracy in the positioning of the substrate and thus of the target portion to which the pattern is to be transferred. Similar considerations may apply to a patterning structure and support structure configured to hold a patterning structure. Thus, heat may form a restricting factor for the performance of the motor. For example, the temperature limit for the motor (does the motor survive the high temperatures?) and/or the heat transfer to other parts (how much heat is transported to the highly accurate patterning device support structure and/or substrate table parts?) may restrict the maximum force. Thus, specific power densities (amount of dissipated heat per unit motor volume) may be limited by thermal specifications.

Similarly, heat transfer considerations may apply to other heat sources whether relating to a lithographic apparatus or not, that may increase the temperature of a structure or environment desired to be kept a regulated lower temperature.

SUMMARY

Accordingly, it would be advantageous, for example, to provide an improved manner of cooling to reduce or eliminate heat transfer.

According to an aspect of the invention, there is provided a cooling apparatus comprising:

a first cooling structure, in thermal contact with a heat source having a temperature greater than a cool structure, comprising a channel through which a cooling fluid is passed;

an isolator between the heat source and the cool structure, the isolator in thermal contact with the first cooling structure and comprising a material of low thermal conductivity; and a second cooling structure between the isolator and the cool structure, the second cooling structure comprising a channel configured to circulate a cooling fluid.

According to an aspect of the invention, there is provided a lithographic apparatus configured to transfer a pattern from a patterning structure to a substrate, comprising:

a support structure configured to hold the patterning structure;

a substrate table configured to hold the substrate;

one or more coil motors configured to move the support structure, the substrate table, or both; and the support structure, the substrate table, or both, having a coil of the respective coil motor and having:

a first cooling structure, in thermal contact with the coil, comprising a channel through which a cooling fluid is passed, the coil having a temperature greater than a cool structure of the support structure, the substrate table, or both, an isolator between the coil and the cool structure, the isolator in thermal contact with the first cooling structure and comprising a material of low thermal conductivity, and a second cooling structure between the isolator and the cool structure, the second cooling structure comprising a channel through which cooling fluid is passed.

According to another aspect of the invention, there is provided A device manufacturing method, comprising:

moving a support structure configured to hold a patterning structure, a substrate table configured to hold a substrate, or both, using one or more coil motors, the support structure, the substrate table, or both, having a coil of the respective coil motor;

passing a cooling fluid through a first cooling structure in thermal contact with the coil, the coil having a temperature greater than a cool structure of the support structure, the substrate table, or both, and the first cooling structure in thermal contact with an isolator, between the coil and the cool structure, comprising a material of low thermal conductivity;

passing a cooling fluid through a second cooling structure between the isolator and the cool structure; and transferring a pattern from the patterning structure to the substrate.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
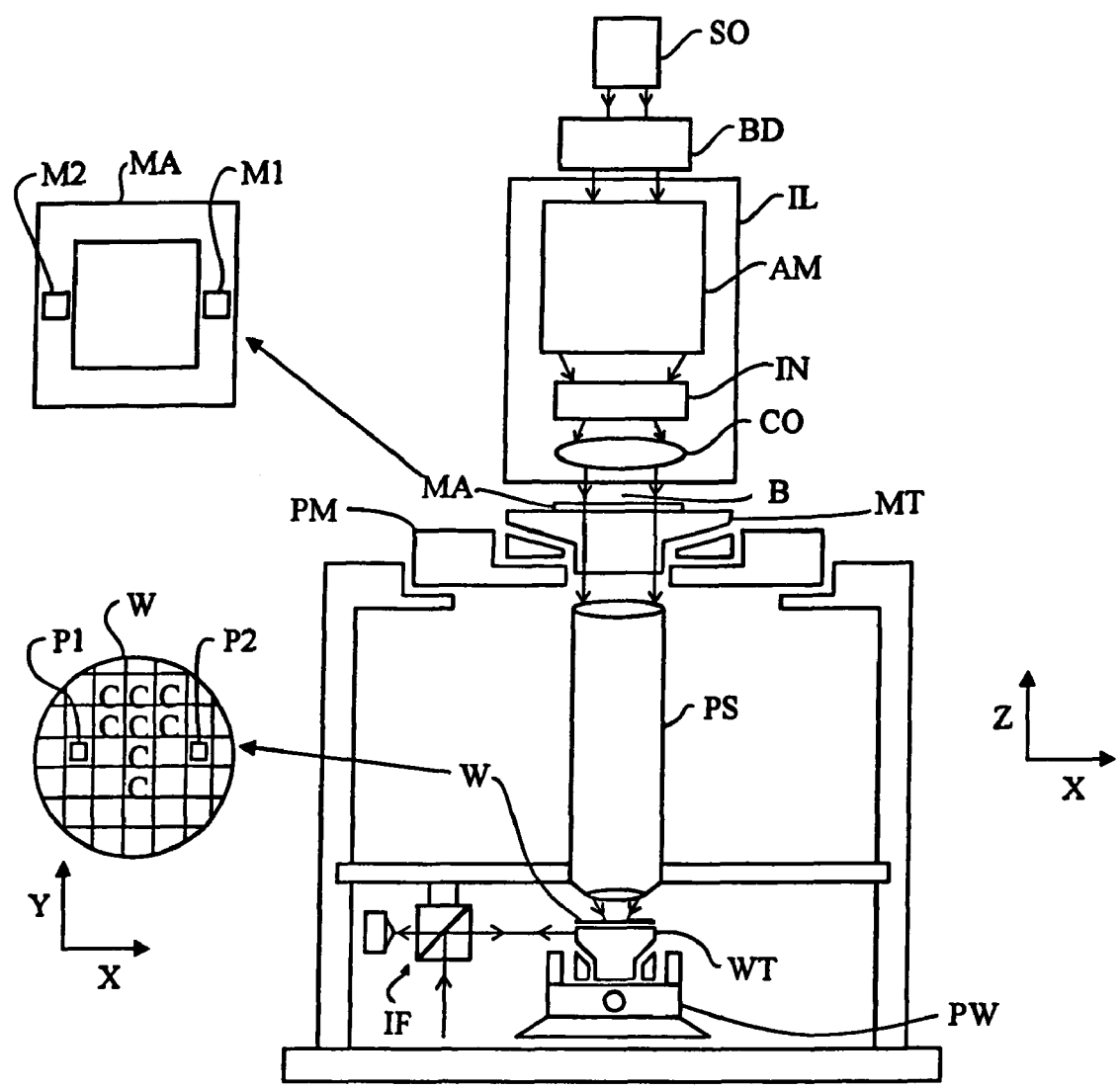
FIG. 1 is a schematic illustration of a lithographic projection apparatus according to an embodiment of the invention.

FIG. 1 schematically depicts a lithographic apparatus, in particular a lithographic exposure apparatus, according to an embodiment of the invention. The apparatus comprises:
- an illumination system (illuminator) IL configured to condition a radiation beam B (e.g. UV radiation or DUV radiation).
- a support structure (e.g. a mask table) MT constructed to support a patterning structure (e.g. a mask) MA and connected to a first positioner PM configured to accurately position the patterning structure in accordance with certain parameters;
- a substrate table (e.g. a wafer table) WT constructed to hold a substrate (e.g. a resist-coated wafer) W and connected to a second positioner PW configured to accurately position the substrate in accordance with certain parameters; and
- a projection system (e.g. a refractive projection lens system) PS configured to project a pattern imparted to the radiation beam B by patterning structure MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure holds the patterning structure in a manner that depends on the orientation of the patterning structure, the design of the lithographic apparatus, and other conditions, such as for example whether or not the patterning structure is held in a vacuum environment. The support structure can use mechanical, vacuum, electrostatic or other clamping techniques to hold the patterning structure. The support structure may be a frame or a table, for example, which may be fixed or movable as required. The support structure may ensure that the patterning structure is at a desired position, for example with respect to the projection system. Any use of the terms "reticle" or "mask" herein may be considered synonymous with the more general term "patterning structure."

The term "patterning structure" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning structure may be transmissive or reflective. Examples of patterning structures include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more support structures). In such "multiple stage" machines the additional tables/support structure may be used in parallel, or preparatory steps may be carried out on one or more tables/support structure while one or more other tables/support structures are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning structure (e.g., mask) MA, which is held on the support structure (e.g., mask table) MT, and is patterned by the patterning structure. Having traversed the patterning structure MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning structure MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning structure MA and substrate W may be aligned using patterning structure alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning structure MA, the patterning structure alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning structure, and the substrate table WT is moved or scanned while a pattern imparted to the radiation beam is projected onto a target portion C. In this mode, generally a pulsed radiation source is employed and the programmable patterning structure is updated as required after each movement of the substrate table WT or in between successive radiation pulses during a scan. This mode of operation can be readily applied to maskless lithography that utilizes programmable patterning structure, such as a programmable mirror array of a type as referred to above.

Combinations and/or variations on the above described modes of use or entirely different modes of use may also be employed.

Figure 2:
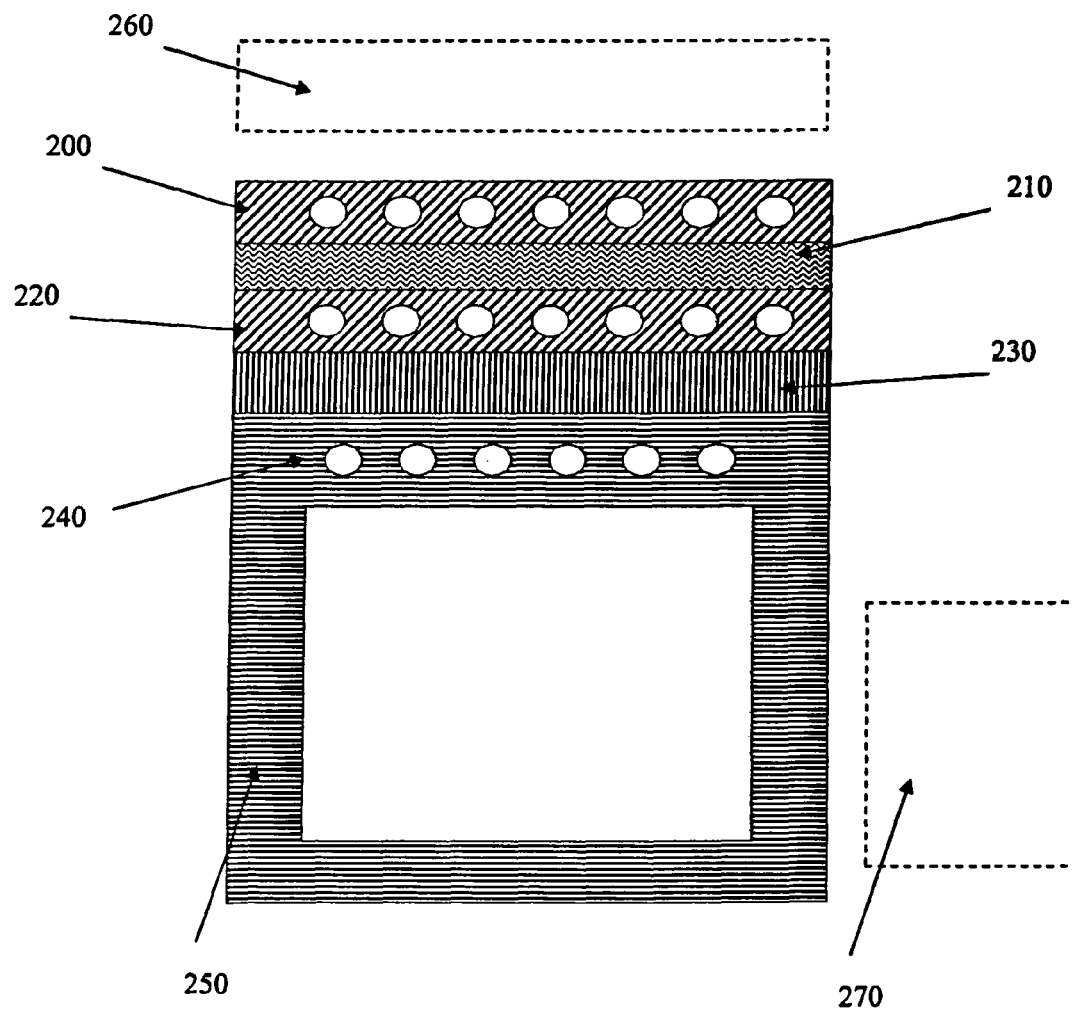
FIG. 2 is a schematic cross-section representation of cooling apparatus according to an embodiment of the present invention.

Referring to FIG. 2, a schematic cross-section representation of cooling apparatus according to an embodiment of the present invention is depicted. In this embodiment, part of a movable support structure configured to hold a patterning structure (e.g., mask) is depicted, including an associated motor part that acts as a heat source. It should be appreciated than an embodiment of the invention may be embodied in any apparatus, whether movable or not. An embodiment for a movable substrate table is described in more detail hereafter.

In FIG. 2, the movable support structure comprises a coil 210 of a motor (extending in the Y direction), the coil 210 is the heat source and configured to operatively cooperate with a magnet shown schematically as 260, so that when the coil is energized a force is generated between the magnet and the coil to move the support structure (e.g., in the Y direction). In an embodiment, the magnet 260 may provided as part of the movable support structure as the heat source 210. Advantageously, the heat source 210 is a coil that is part of the movable support structure as use of a coil may beneficially reduce the mass of the support structure compared to the use of a magnet (e.g., a moving mass reduction of a factor of 10 may be achievable compared to a moving magnet arrangement). In an embodiment, the motor is that of a short-stroke actuator configured to move the support structure small displacements, while a long-stroke actuator is used to move the support structure long displacements. In an embodiment, the long-stroke actuator is configured to move the short-stroke actuator along with a part of the movable support structure that holds the patterning structure.

Since the coil 210 dissipates heat, the coil is at least partly surrounded by a cooling structure 200 and 220 of high thermally conductive material, the cooling structure 200 and 220 comprising one or more channels (extending in the Y direction) through which a cooling fluid passes (e.g., water). In an embodiment, the cooling structure 200 and 220 is a substantially planar body. In an embodiment, a plurality of channels are evenly distributed through the cooling structure 200 and 220.

In an embodiment, the material of the cooling structure 200 and 220 has a thermal conductivity of about 150 W/mK. In an embodiment, the material may comprise a ceramic, a plastic, or a composite material. In an embodiment, the material comprises $Al_2O_3$, AlN or SiC. In an embodiment, the material has low or no electrical conductivity, which helps to prevent undesirable eddy-current damping within the magnetic field of the stator.

The cooling structure 200 and 220 removes the majority of the heat from the coil. In an embodiment, motor cooling water is supplied through the channels of cooling structure 200 and 220, the motor cooling water configured to remove a significant amount of heat. In an embodiment, different cooling fluid (e.g., different type or different source) may be passed through the channels of cooling structure part 200 than through the channels of cooling structure part 220. For example, colder water may be passed through the channels of cooling structure part 200 than the channels of cooling structure part 220.

In an embodiment, heat is removed directly from the coil 210 to the cooling fluid through a large area of contact, thus reducing substantially the amount of heat escaping to the surrounding components and therefore reducing inaccuracies caused by thermal expansion.

In an embodiment, the cooling structure 200, 220 is attached directly onto the upper and lower surfaces of the coil 210. Alternatively, the cooling jacket may cover the entire coil including a center portion where there are no windings. In addition a single cooling structure 200 and 220 may be attached to and provide cooling for a plurality of coils. In an embodiment, the cooling structure 200, 220 may be interposed between layers of one or more coils so as to form an assembly of alternating layers of coil and cooling structure.

In an embodiment, the channels of cooling structure 200, 220 are substantially parallel to the plane of the cooling structure 200, 220 (substantially in the Y direction). In an embodiment, cooling structure parts 200 and 220 are respectively attached to the surface of the coil 210 with a thermally conductive but electrically insulating material. Thus the heat from the coil will be conducted through the cooling structure parts 200 and 220 into the cooling fluid. In an embodiment, an upper portion of the cooling structure part 200, which is adjacent to the magnet 260, may have a relatively low thermal conductivity to limit heat flow to a surrounding environment.

In an embodiment, the cooling structure 200, 220, and hence the channels within it, is generally thin. This in turn may results in high fluid flow resistance within the channels and therefore the cooling fluid circuit must be operated at high pressure to maintain a sufficient flow rate. The fluid flow resistance and hence pressure may be reduced by increasing the width of the channels. However, increasing the width of the channels may result in large bending stresses in corner regions. Thus, multiple parallel channels may be provided to reduce the fluid flow resistance with reduced maximum bending stresses in corners of the channels.

In an embodiment, the channels may extend linearly in the Y direction, each channel being substantially parallel to the other. In an embodiment, the channels may extend in the Y direction but in a serpentine fashion to increase the fluid flow through an area of the cooling structure.

The cooling structure channels may have one or more connections (not shown) to a cooling system (not shown), the cooling system configured to remove the heat put into the cooling fluid from the coil 210 and to regulate the temperature of the cooling fluid to a certain value.

The coil 210 is connected (via cooling structure part 220) to a cool structure 250, the cool structure 250 desired to be kept at a temperature less than the coil 220. In this embodiment, the cool structure is part of a table configured to hold the patterning structure, the patterning structure shown schematically as 270 and desired to be kept at a substantially constant temperature to avoid expansion or contraction. In an embodiment, the cool structure may be a substrate onto which a pattern is transferred with a lithographic or other process. The cool structure may be any structure or environment that is desired to be kept at temperature lower than a temperature of a nearby structure or environment. In an embodiment, the thermal conductivity of the material of the cool structure 250 is about 10 W/mK and may be a ceramic or glass.

Between the coil 210 and the cool structure 250, a thermal isolator 230 is provided, the thermal isolator being in thermal contact with the cooling structure part 220. In an embodiment, the material of the isolator has a thermal conductivity of less than or equal to 1 W/mK, for example, 0.5 W/mK. In an embodiment, the material is a plastic and may be stiff. If cooling structure part 220 were attached directly to the cool structure 250, too much heat (e.g., 1 W) may be transported to the cool structure 250.

Further, another cooling structure 240 is provided between the coil 210 and the cool structure 250, the cooling structure 240 comprising one or more channels through which a cooling fluid passes (e.g., water). The cooling structure 240 removes much, if not all, of the heat from the coil that passes the cooling structure 200 and 220 and the isolator 230. In an embodiment, projection system cooling water is supplied through the channels of cooling structure 240, the projection system cooling water configured to remove an amount of heat significantly less than the heat removed by the motor cooling water (e.g., the temperature of the projection system cooling water being higher than the temperature of the motor cooling water). Cooling structure 240 thus removes substantially all or most of the remaining heat from the heat source 210 to prevent or reduce the cool structure 250 from heating. A typical allowable temperature rise of the cool structure 250 is between about 10 to 100 mK, limited by restrictions on thermal expansion (i.e., 100 mK may be too high if the cool structure 250 would expand significantly with that temperature rise). In this embodiment, the cooling structure 240 is in thermal contact with the isolator 230, although it need not be. Further, in this embodiment, the cooling structure 240 is integrated in the cool structure 250 at an end nearer the isolator 230 than a substantial other portion of the cool structure 250. The cooling structure 240 may have one or more of the characteristics of cooling structure 200, 220.

Figure 3:
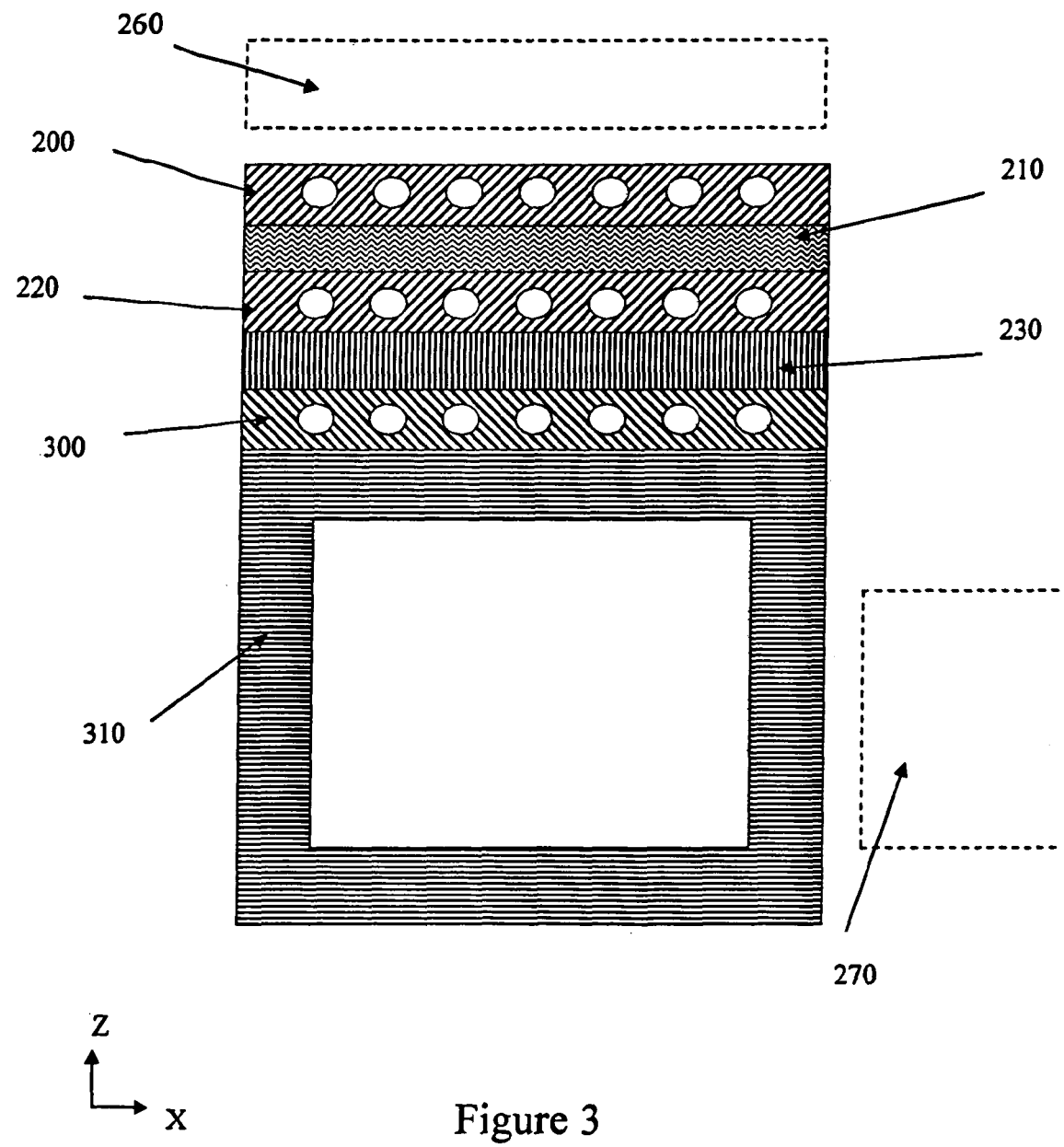
FIG. 3 is a schematic cross-section representation of cooling apparatus according to an embodiment of the present invention.

FIG. 3 depicts a schematic cross-section representation of a cooling apparatus according to another embodiment of the present invention. This embodiment is similar to the embodiment described with respect to FIG. 1, except as identified below. Instead of cooling structure 240 being part of cool structure 250, cooling structure 300 is provided separately from cool structure 310. In this embodiment, the material of the cooling structure 200 and 220 has a thermal conductivity of about 150 W/mK. In an embodiment, the material comprises SiC.

Figure 4:
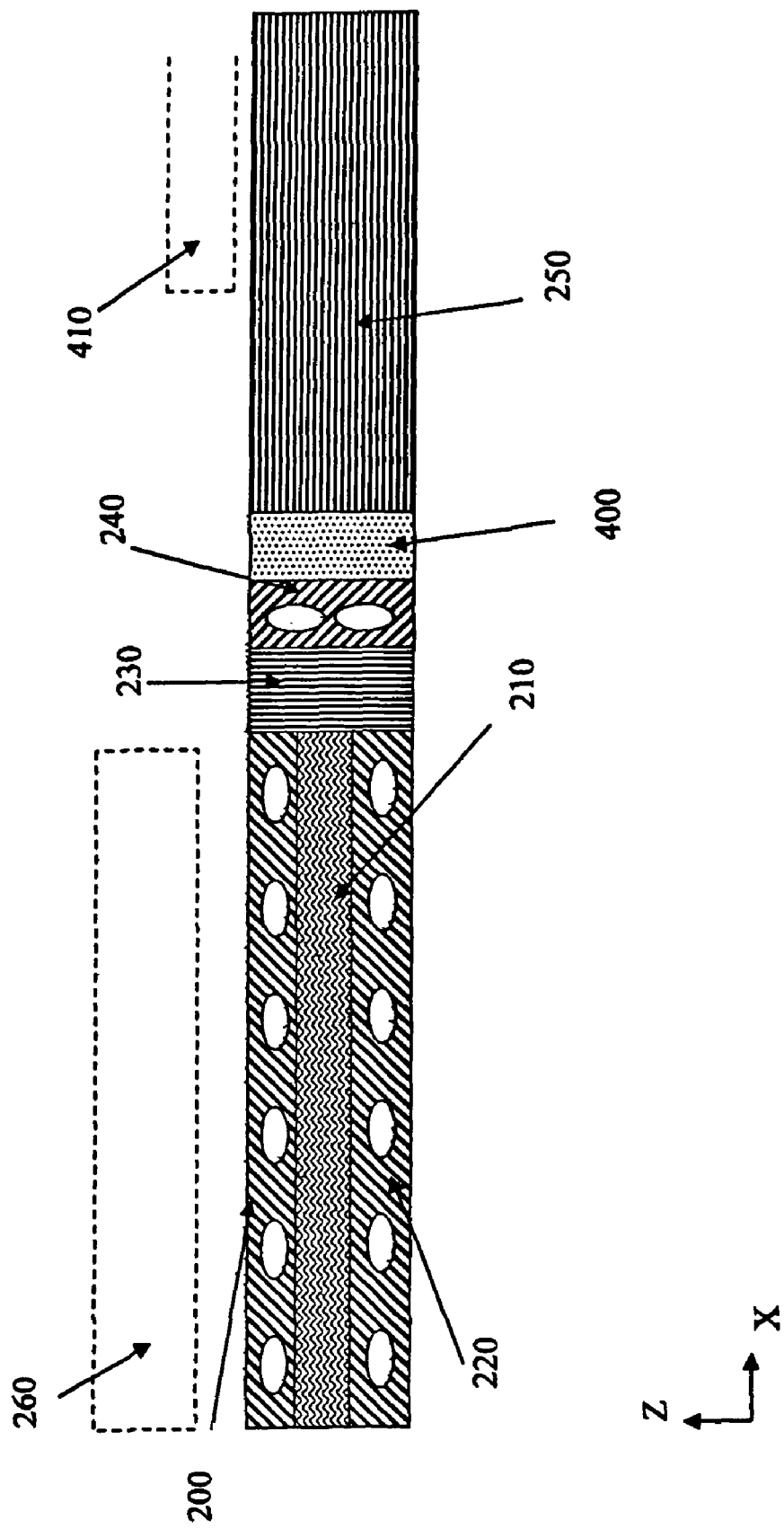
FIG. 4 is a schematic cross-section representation of cooling apparatus according to an embodiment of the present invention.

FIG. 4 depicts a schematic cross-section representation of a cooling apparatus according to another embodiment of the present invention. In this embodiment, part of a movable substrate table configured to hold a substrate onto which a pattern is to be transferred is depicted, including an associated motor part that acts as a heat source. It should be appreciated than an embodiment of the invention may be embodied in any apparatus, whether movable or not.

In FIG. 4, the movable substrate table comprises a coil 210 of a motor, the coil 210 is the heat source and configured to operatively cooperate with a magnet shown schematically as 260, so that when the coil is energized a force is generated between the magnet and the coil to move the substrate table (e.g., in the Y direction). In an embodiment, the magnet 260 may provided as part of the movable substrate table as the heat source 210. Advantageously, the heat source 210 is a coil that is part of the movable substrate table as use of a coil may beneficially reduce the mass of the substrate table compared to the use of a magnet (e.g., a moving mass reduction of a factor of 10 may be achievable compared to a moving magnet arrangement). In an embodiment, the motor is that of a short-stroke actuator configured to move the subtrate table small displacements, while a long-stroke actuator is used to move the substrate table long displacements. In an embodiment, the long-stroke actuator is configured to move the short-stroke actuator along with a part of the movable substrate table that holds the patterning structure.

Since the coil 210 dissipates heat, the coil is at least partly surrounded by a cooling structure 200 and 220 of high thermally conductive material, the cooling structure 200 and 220 comprising one or more channels through which a cooling fluid passes (e.g., water). In an embodiment, the material of the cooling structure 200 and 220 has a thermal conductivity of about 150 W/mK. In an embodiment, the material comprises SiC. In an embodiment, the material has low or no electrical conductivity. The cooling structure 200 and 220 removes the majority of the heat from the coil. In an embodiment, motor cooling water is supplied through the channels of cooling structure 200 and 220, the motor cooling water configured to remove a significant amount of heat. In an embodiment, different cooling fluid (e.g., different type or different source) may be passed through the channels of cooling structure part 200 than through the channels of cooling structure part 220. For example, colder water may be passed through the channels of cooling structure part 200 than the channels of cooling structure part 220. The cooling structure 200, 220 may have one or more of the characteristics as described in reference to FIG. 2.

The coil 210 is connected (via cooling structure part 220) to a cool structure 250, the cool structure 250 desired to be kept at a temperature less than the coil 220. In this embodiment, the cool structure is part of a table configured to hold a substrate, the substrate shown schematically as 410 and desired to be kept at a substantially constant temperature to avoid expansion or contraction. The cool structure may be any structure or environment that is desired to be kept at temperature lower than a temperature of a nearby structure or environment. In an embodiment, the thermal conductivity of the material of the cool structure 250 is about 10 W/mK and may be a ceramic.

Between the coil 210 and the cool structure 250, a thermal isolator 230 is provided, the thermal isolator being in thermal contact with the cooling structure part 220. In an embodiment, the material of the isolator has a thermal conductivity of less than or equal to 1 W/mK, for example, 0.5 W/mK. In an embodiment, the material is a plastic and may be stiff. In an embodiment, the isolator has a low or no electrical conductivity. If cooling structure parts 200 and/or 220 were attached directly to the cool structure 250, too much heat (e.g., 1 W) may be transported to the cool structure 250. While not shown in FIG. 4, the cooling structure 200 and 220 may extend to between the coil 210 and the isolator 230 such that the thermal isolator is not in direct thermal contact with coil 210 and thus may not have low or no electrical conductivity.

Further, another cooling structure 240 is provided between the coil 210 and the cool structure 250, the cooling structure 240 comprising one or more channels through which a cooling fluid passes (e.g., water). The cooling structure 240 removes much, if not all, of the heat from the coil 210 that passes the cooling structure 200 and 220 and the isolator 230. In an embodiment, projection system cooling water is supplied through the channels of cooling structure 240, the projection system cooling water configured to remove an amount of heat significantly less than the heat removed by the motor cooling water (e.g., the temperature of the projection system cooling water being higher than the temperature of the motor cooling water). Cooling structure 240 thus removes substantially all or most of the remaining heat from the heat source 210 to prevent or reduce the cool structure 250 from heating. A typical allowable temperature rise of the cool structure 250 is between about 10 to 100 mK, limited by restrictions on thermal expansion (i.e., 100 mK may be too high if the cool structure 250 would expand significantly with that temperature rise). In this embodiment, the cooling structure 240 is in thermal contact with the isolator 230, although it need not be. The cooling structure 240 may have one or more of the characteristics as described in reference to FIG. 2.

Further, a compensator 400 is provided to compensate for expansion or contraction due the heat from the coil 210 of, for example, the isolator 230 and/or the cooling structure 240. In an embodiment, the compensator 400 is a spring, for example, a leaf spring. In an embodiment, the compensator 400 is provided between the cooling structure 240 and the cool structure 250.

Figure 5:
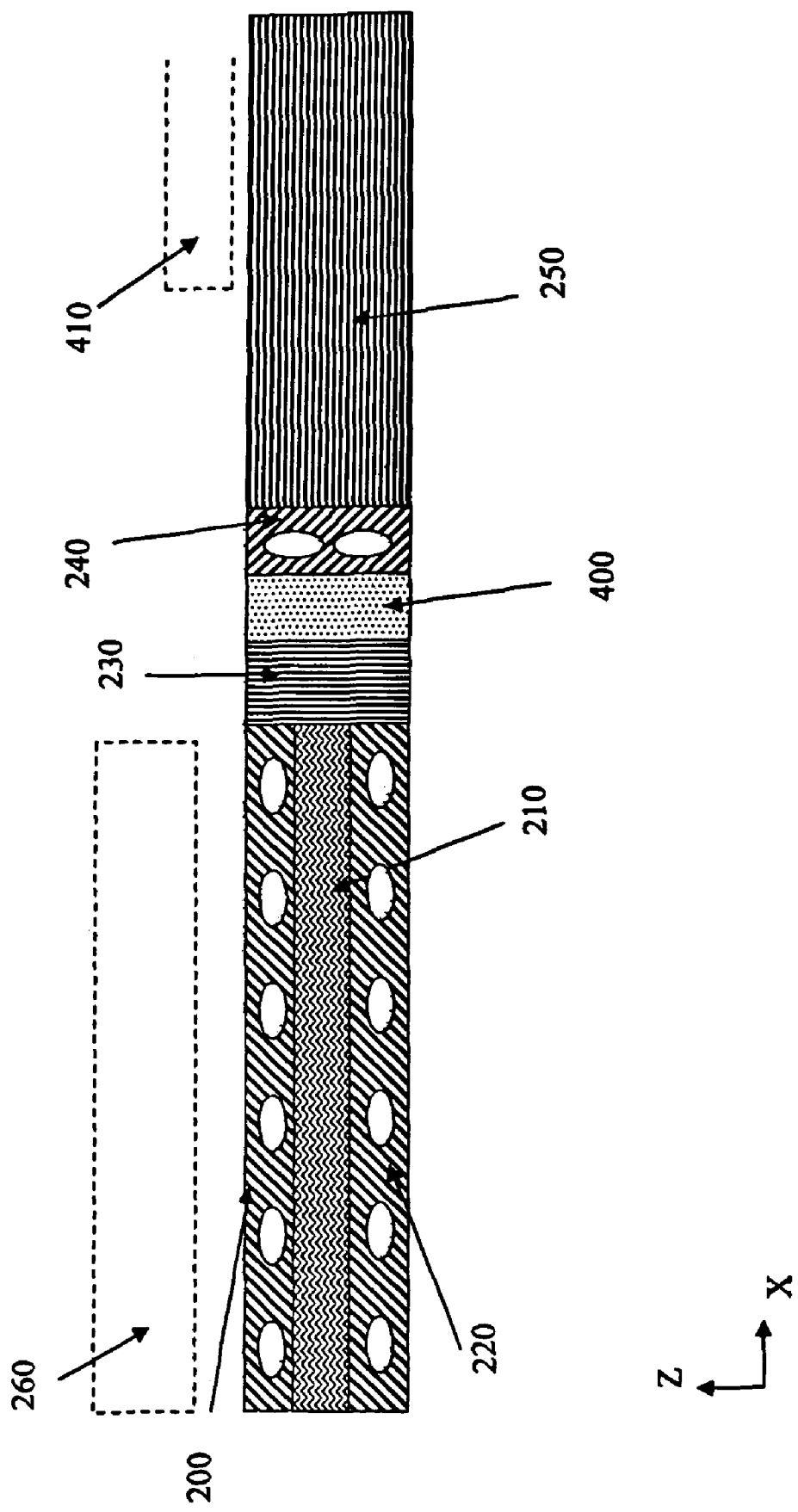
FIG. 5 is a schematic cross-section representation of cooling apparatus according to an embodiment of the present invention.

FIG. 5 depicts a schematic cross-section representation of a cooling apparatus according to another embodiment of the present invention. This embodiment is similar to the embodiment described with respect to FIG. 4, except as identified below. Instead of the compensator 400 being between the cooling structure 240 and the cool structure 250, the compensator 400 is located between the isolator 230 and the cooling structure 240.

Figure 6:
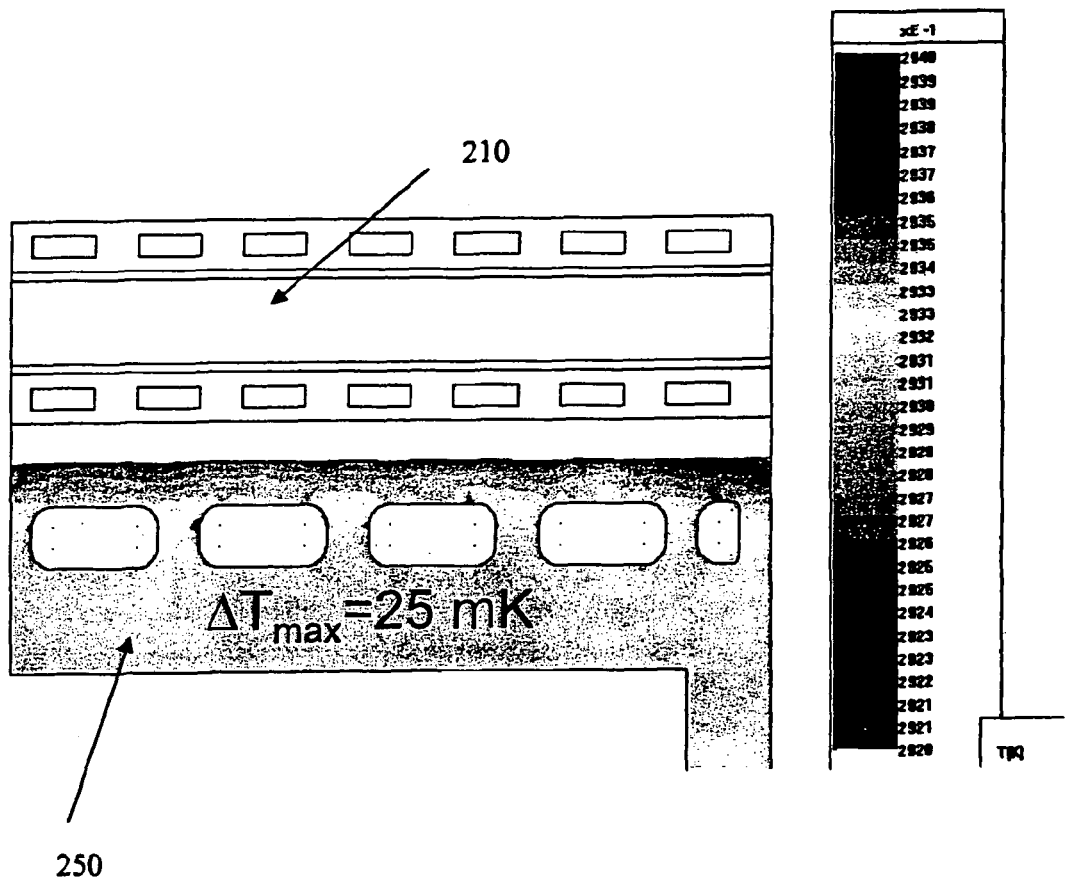
FIG. 6 is a simulated temperature distribution through a partial schematic cross-section representation of the cooling apparatus of FIG. 2.
Figure 7:
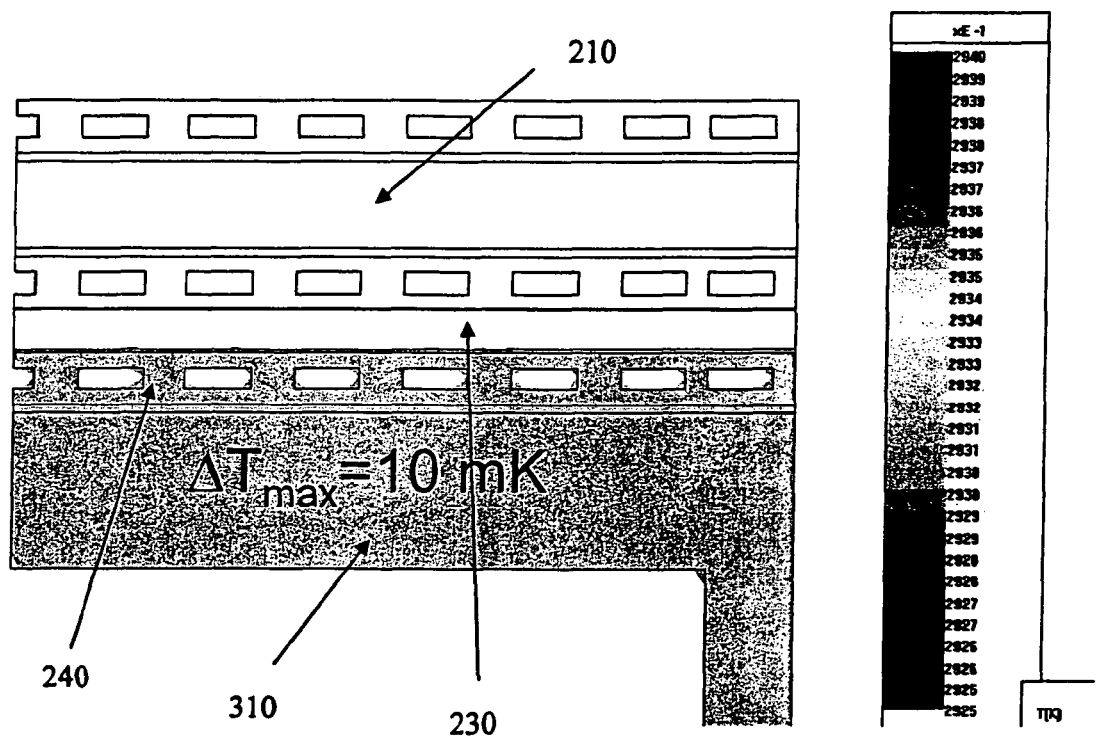
FIG. 7 is a simulated temperature distribution through a partial schematic cross-section representation of the cooling apparatus of FIG. 3.

FIG. 6 shows details of the temperature distribution in cool structure 250 connected to the cooling apparatus of FIG. 2, where a typical amount of heat is dissipated in the heat source 210. FIG. 7 shows details of the temperature distribution in cool structure 310 connected to the cooling apparatus of FIG. 3, where a typical amount of heat is dissipated in the heat source 210. As can be seen, the cooling apparatus according to an embodiment of the invention may greatly control the difference in temperature in the cool structure 250 and 310 where a heat source 210 is closely present to the cool structure 250 and 310. In an embodiment, the temperature rise of the cool structure is decreased by a factor of more than or equal to 100 times compared to a cooling apparatus without an isolator and another cooling structure.

Although specific reference may be made herein to the use of lithographic exposure apparatus in the manufacture of ICs, it should be understood that the lithographic exposure apparatus described herein may have other applications, such as the manufacture of integrated optical systems, guidance and detection patterns for magnetic domain memories, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5-20 nm), as well as particle beams, such as ion beams or electron beams.

The term "patterning structure" used herein should be broadly interpreted as referring to any device that can be used to impart a beam with a pattern in its cross-section such as to create a pattern in a target portion of the substrate. It should be noted that the pattern imparted to the beam may not exactly correspond to the desired pattern in the target portion of the substrate. Generally, the pattern imparted to the beam will correspond to a particular functional layer in a device being created in the target portion, such as an integrated circuit.

A patterning structure may be transmissive or reflective. Examples of patterning structures include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned.

The support structure holds the patterning structure in a way depending on the orientation of the patterning structure, the design of the lithographic exposure apparatus, and other conditions, such as for example whether or not the patterning structure is held in a vacuum environment. The support can use mechanical clamping, vacuum, or other clamping techniques, for example electrostatic clamping under vacuum conditions. The support structure may be a frame or a table, for example, which may be fixed or movable as required and which may ensure that the patterning structure is at a desired position, for example with respect to the projection system. Any use of the terms "reticle" or "mask" herein may be considered synonymous with the more general term "patterning structure".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "projection lens" herein may be considered as synonymous with the more general term "projection system".

The illumination system may also encompass various types of optical components, including refractive, reflective, and catadioptric optical components for directing, shaping, or controlling the beam of radiation, and such components may be referred to below, collectively or singularly, as a "lens".

The lithographic exposure apparatus may be of a type having two (dual stage) or more substrate tables (and/or two or more support structures). In such "multiple stage" machines the additional tables may be used in parallel, or preparatory steps may be carried out on one or more tables while one or more other tables are being used for exposure.

The lithographic exposure apparatus may also be of a type wherein a surface of the substrate is immersed in a liquid having a relatively high refractive index, e.g. water, so as to fill a space between a final element of the projection system and the substrate. Immersion liquids may also be applied to other spaces in the lithographic exposure apparatus, for example, between the patterning structure and a first element of the projection system. Immersion techniques are well known in the art for increasing the numerical aperture of projection systems.

The methods described herein may be implemented as software, hardware or a combination. In an embodiment, there is provided a computer program product comprising program code that, when executed on a computer, instructs the computer to perform any or all of the methods described herein.

The description herein refers to the accompanying drawings that illustrate exemplary embodiments consistent with the invention. Other embodiments are possible and modifications may be made to the embodiments without departing from the spirit and scope of the invention. As such, the configuration, operation and behavior of the present invention will be described with the understanding that modifications and variations of the embodiments are possible, given the level of detail present herein. Thus, the description and/or accompanying drawings herein are not meant or intended to limit the invention—rather the scope of the invention is defined by the appended claims.

We claim:

1. A cooling apparatus, comprising:
    a first cooling structure of a first solid material, in thermal contact with a heat source having a temperature greater than a cool structure, which forms a channel through which a cooling fluid is passed;
    a second cooling structure, between the first cooling structure and the cool structure, in physical contact with the cool structure and no part of the cool structure being between the first and second cooling structures, the second cooling structure forming a channel through which cooling fluid is passed and there being no heat source in direct physical contact with the second cooling structure; and
    an isolator of a second solid material between and separating the first cooling structure and the second cooling structure, the isolator in thermal contact with the first cooling structure and the second solid material having a thermal conductivity lower than that of the first solid material of the first cooling structure.

2. The apparatus of claim 1, further comprising a coil of a motor, the coil is the heat source and configured to operatively cooperate with a magnet, so that when the coil is energized a force is generated between the magnet and the coil.

3. The apparatus of claim 1, wherein the cool structure is a substrate table of a lithographic apparatus configured to hold a substrate or a support structure of a lithographic apparatus configured to hold a patterning structure, the patterning structure configured to impart a pattern to a beam of radiation in the lithographic apparatus.

4. The apparatus of claim 1, further comprising a compensator between the isolator and the cool structure, the compensator configured to compensate for an expansion or contraction of the isolator, the second cooling structure, or both.

5. The apparatus of claim 4, wherein the compensator comprises a leaf spring.

6. The apparatus of claim 1, wherein the channel of the first cooling structure is arranged to be substantially located in a portion of the first cooling structure adjacent to the heat source.

7. The apparatus of claim 1, wherein the first cooling structure, the second cooling structure, or both, comprises a plurality of channels which are configured such that the channels are evenly distributed in the portion of the respective cooling structure adjacent to the respective heat source, isolator, or both.

8. The apparatus of claim 1, wherein the cooling fluid is water.

9. The apparatus of claim 1, wherein the first cooling structure is made from an electrically non-conducting material.

10. The apparatus of claim 1, wherein the first cooling structure, the second cooling structure, or both, is made from a ceramic.

11. The apparatus of claim 10, wherein the ceramic is selected from the group comprising SiC, $Al_2O_3$ and AlN.

12. A lithographic apparatus configured to transfer a pattern from a patterning structure to a substrate, comprising:
    a support structure configured to hold the patterning structure;
    a substrate table configured to hold the substrate;
    one or more coil motors configured to move the support structure, the substrate table, or both; and
    the support structure, the substrate table, or both, having a coil of the respective coil motor and having:
        a first cooling structure of a first solid material, in thermal contact with the coil, which forms a channel through which a cooling fluid is passed, the coil having a temperature greater than a cool structure of the support structure, the substrate table, or both,
        a second cooling structure, between the first cooling structure and the cool structure, in physical contact with the cool structure and no part of the cool structure being between the first and second cooling structures, the second cooling structure forming a channel through which cooling fluid is passed and there being no heat source in direct physical contact with the second cooling structure, and
        an isolator of a second solid material between and separating the first cooling structure and the second cooling structure, the isolator in thermal contact with the first cooling structure and the second material having a thermal conductivity lower than that of the first material of the first cooling structure.

13. The apparatus of claim 12, further comprising a compensator between the isolator and the cool structure, the compensator configured to compensate for an expansion or contraction of the isolator, the second cooling structure, or both.

14. The apparatus of claim 13, wherein the compensator comprises a leaf spring.

15. The apparatus of claim 12, wherein the cooling fluid is water.

16. The apparatus of claim 12, wherein the first cooling structure is made from an electrically non-conducting material.

17. The apparatus of claim 12, wherein the first cooling structure, the second cooling structure, or both, made from a ceramic.

18. The apparatus of claim 17, wherein the ceramic is selected from the group comprising SiC, $Al_2O_3$ and AlN.

19. A device manufacturing method, comprising:
moving a support structure configured to hold a patterning structure, a substrate table configured to hold a substrate, or both, using one or more coil motors, the support structure, the substrate table, or both, having a coil of the respective coil motor;
passing a cooling fluid through a first cooling structure of a first solid material in thermal contact with the coil, the coil having a temperature greater than a cool structure of the support structure, the substrate table, or both;
passing a cooling fluid through a second cooling structure, between the first cooling structure and the cool structure, in physical contact with the cool structure and no part of the cool structure being between the first and second cooling structures, wherein there is no heat source in direct physical contact with the second cooling structure and the first cooling structure is in thermal contact with an isolator of a second solid material between and separating the first cooling structure and the second cooling structure, the second material having a thermal conductivity lower than that of the first material of the first cooling structure; and
transferring a pattern from the patterning structure to the substrate.

20. The method of claim 19, further comprising compensating for an expansion or contraction of the isolator, the second cooling structure, or both, by using a compensator between the isolator and the cool structure.

21. The method of claim 19, wherein the first cooling structure, the second cooling structure, or both, is made from a ceramic.

* * * * *